United States Patent [19]

Hashimoto et al.

[11] Patent Number: 4,870,284

[45] Date of Patent: Sep. 26, 1989

[54] ION SOURCE AND METHOD OF DRAWING OUT ION BEAM

[75] Inventors: Isao Hashimoto; Hideshi Kadooka, both of Hitachi, Japan

[73] Assignee: Hitachi, Ltd., Tokyo, Japan

[21] Appl. No.: 271,682

[22] Filed: Nov. 16, 1988

[30] Foreign Application Priority Data

Nov. 17, 1987 [JP] Japan ................................. 62-290345

[51] Int. Cl.⁴ ................................................. A01J 7/24
[52] U.S. Cl. ........................ 250/423 R; 250/423 F; 250/424; 250/426; 250/427; 250/492.3; 313/360.1; 315/111.81
[58] Field of Search ............... 250/423 R, 423 F, 424, 250/426, 427, 492.3; 313/360.1, 361.1, 362.1, 231.31; 315/111.31, 111.81; 328/233

[56] References Cited

U.S. PATENT DOCUMENTS

| | | | |
|---|---|---|---|
| 4,713,585 | 12/1987 | Ohno et al. ...................... | 250/423 R |
| 4,739,169 | 4/1988 | Kurosawa et al. ............. | 250/423 R |
| 4,742,232 | 5/1988 | Biddle et al. ...................... | 250/423 R |
| 4,767,931 | 8/1988 | Sato et al. ........................ | 250/423 R |

FOREIGN PATENT DOCUMENTS

| | | | |
|---|---|---|---|
| 130039 | 7/1985 | Japan .............................. | 250/423 R |
| 133376 | 6/1986 | Japan . | |
| 278733 | 12/1987 | Japan .............................. | 250/423 R |
| 278736 | 12/1987 | Japan .................................. | 250/427 |

*Primary Examiner*—Janice A. Howell
*Assistant Examiner*—John A. Miller
*Attorney, Agent, or Firm*—Antonelli, Terry & Wands

[57] ABSTRACT

An ion source including a plasma chamber for generating a plasma therein, at least three parallel electrodes for drawing out an ion beam from the plasma chamber, the first and second power sources for generating high and low drawing voltages, respectively, is disclosed in which the first power source is connected between the first pair of adjacent electrodes spaced apart from each other a relatively long distance to perform a high voltage operation, the second power source is connected between a second pair of adjacent electrodes spaced apart from each other a relatively short distance to perform a low voltage operation, and one of the high voltage operation and low voltage operation is changed over to the other with the aid of switching elements.

6 Claims, 7 Drawing Sheets

ION SOURCE AND METHOD OF DRAWING OUT ION BEAM

BACKGROUND OF THE INVENTION

The present invention relates to an ion source, and more particularly to an ion source operable in a wide operating voltage range and a method of drawing out an ion beam from the ion source.

In recent years, attention has been paid to the formation of a film using the ion beam mixing method and the ion beam assisted method, and various processes for forming a thin film by combining these methods have been developed. Generally speaking, for the ion beam mixing method, it is required to operate an ion source on a voltage of tens of kilo-volts, while, for the ion beam assisted method, it is required to operate an ion source on a voltage of hundreds to thousands of volts. However, the operation voltage of a conventional ion source is restricted within a narrow range. Accordingly, a conventional thin-film depositing (or forming) apparatus includes an ion source for a high voltage operation and another ion source for a low voltage operation, as described in, for example, JP-A-No. 61-133,376. For the technology with respect to an ion source, reference may be made to U.S. Pat. No. 4,713,585 to Y. Ohno et al., U.S. Pat. No. 4,739,169 to Y. Kurokawa et al., and U.S. patent application Ser. No. 942,711 by T. Sato et al. filed in the name of the same assignee and already allowed.

SUMMARY OF THE INVENTION

As mentioned above, the operation voltage of a conventional ion source is restricted within a narrow range. Accordingly, in the case where it is required to operate an ion source in a wide operation voltage range, it is necessary to provide at least two ion sources, that is, an ion source for a high voltage operation and another ion source for a low voltage operation. Further, in the case where a plurality of ion sources are arranged in an ion beam apparatus so that evaporation or sputtering can be combined with the plurality of the ion sources, the ion beam apparatus becomes complicated in structure.

It is accordingly a first object of the present invention to provide an ion source which can operate in a wide operating voltage range and hence can draw out an ion beam having a desired energy level in a wide energy level range, and which is simple in structure.

It is a second object of the present invention to provide an ion source which is capable of being readily combined with the evaporation, sputtering or the like.

It is a third object of the present invention to provide an ion beam drawing-out method which is applicable to a wide range operating voltage and hence is capable of producing an ion bam having a desired energy level in a wide energy range.

In order to attain the first and second objects, according to an aspect of the present invention, there is provided an ion source in which at least three parallel electrodes are disposed, the distance between a first pair of adjacent electrodes is made longer than the distance between a second pair of adjacent electrodes, a high drawing voltage for a high voltage operation is applied between the first pair of adjacent electrodes, a low drawing voltage for a low voltage operation is applied between the second pair of adjacent electrodes, and one of the high voltage operation and the low voltage operation is changed over to the other with the aid of switching elements.

In order to attain the third object, according to another aspect of the present invention, there is provided a method of drawing out an ion beam from the above ion source, in which method, for example, the high drawing voltage is first applied between the first pair of adjacent electrodes to draw out an ion beam of a high energy level, and then the low drawing voltage is applied between the second pair of adjacent electrodes to draw out an ion beam of a low energy level.

An ion current drawn out from a plasma is proportional to the square of the reciprocal of the distance between a pair of drawing electrodes. Hence, according to the present invention, even when a low voltage operation is performed, a large ion current can be drawn out. When an ion source according to the present invention is incorporated in an ion beam apparatus, the ion beam apparatus is applicable to various processes in a wide technical field.

In more detail, the intensity of an ion beam drawn out from a plasma (that is, the intensity of drawn-out ion current) is determined by the electric field intensity at an aperture provided in an electrode which is in contact with a plasma, that is, is proportional to the above electric field intensity to the three-seconds power. In order to keep the electric field intensity located at the aperture of the above electrode at a low voltage operation substantially equal to the electric field intensity at a high voltage operation, it is necessary either to dispose an additional electrode in the vicinity of the above electrode for the purpose of applying a low drawing voltage therebetween as will be explained in the first embodiment of the present invention, or to make special electrical connection for a low voltage operation in the case where a plasma, a first pair of adjacent electrodes spaced apart from each other a relatively long distance, and a second pair of adjacent electrodes spaced apart from each other a relatively short distance are arranged in the order described. That is, in the low voltage operation, as will be explained in conjunction with FIG. 5 embodiment of the present invention, that electrode of the first pair of adjacent electrodes which is disposed so as to be in contact with the plasma, is put in a floating state so that the plasma reaches the second pair of adjacent electrodes. Hence, when the low drawing voltage is applied between the second pair of adjacent electrodes, a large ion current can be drawn out.

DESCRIPTION OF THE PREFERRED EMBODIMENTS

Figure 1A:
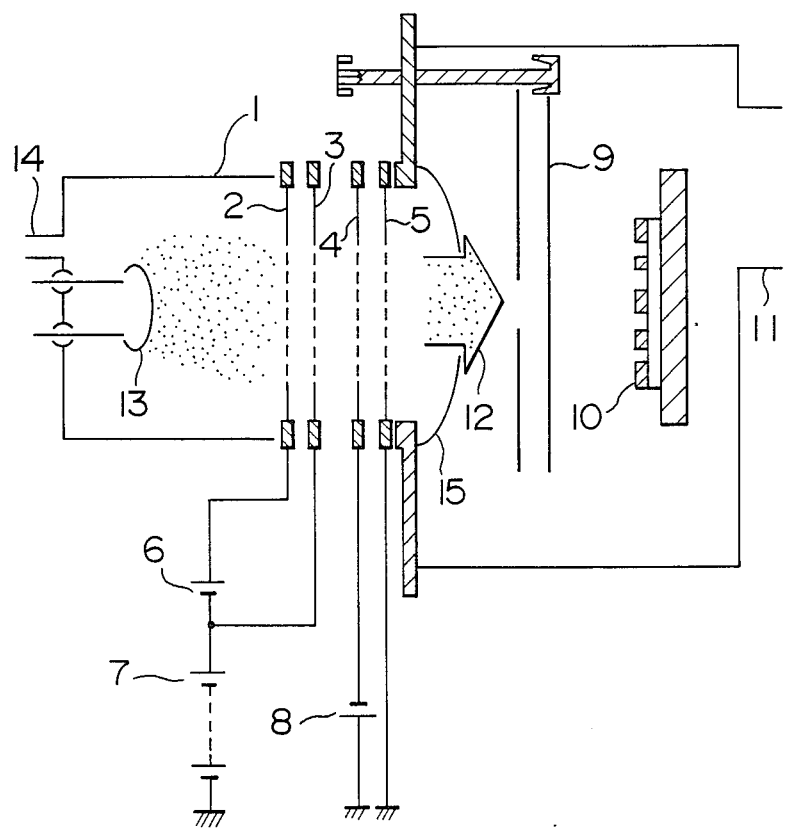
FIGS. 1A and 1B are schematic diagrams showing a high voltage operation and a low voltage operation of a first embodiment of an ion source according to the present invention, respectively.
Figure 1B:
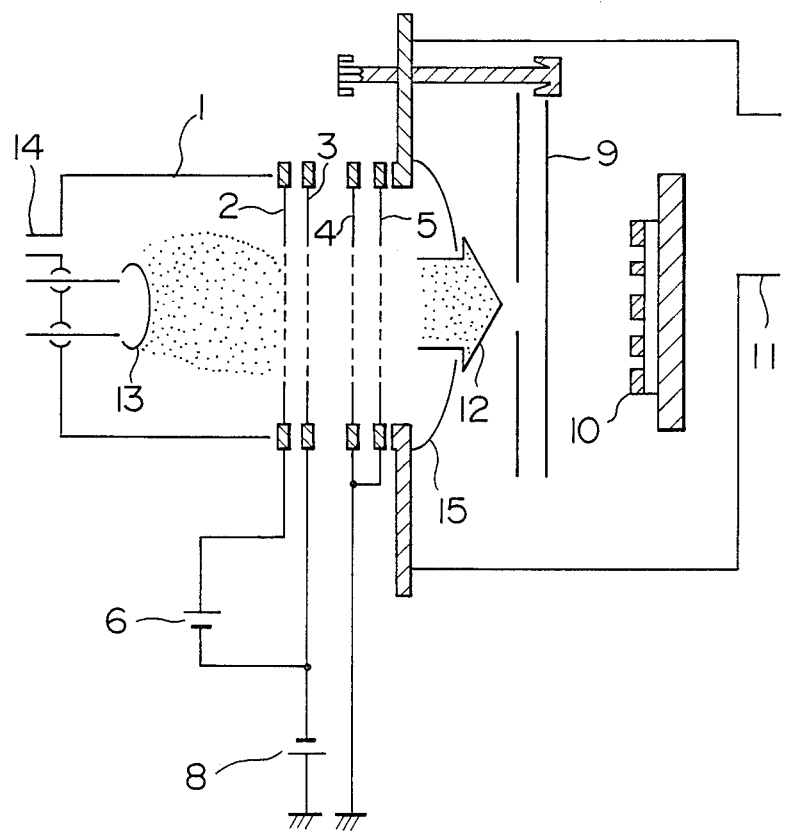

FIGS. 1A and 1B are schematic diagrams showing a first embodiment of an ion source according to the present invention. In more detail, FIG. 1A shows the electrical connection for the high voltage operation of the first embodiment, and FIG. 1B shows the electrical connection for the low voltage operation of the first embodiment. It is to be noted that one of the high-voltage and low-voltage operations shown in FIGS. 1A and 1B can be changed over to the other by means of switching elements (not shown). In FIG. 1A, reference numeral 1 designates a plasma chamber, 2 and 3 accelerating electrodes, 4 a decelerating electrode, and 5 a grounded electrode. The electrodes 2 to 5, each having a plurality of apertures aligned with those disposed in the other electrodes, are used for drawing out an ion beam 12. Further, in FIG. 1A, reference numeral 13 designates a filament, 14 a gas inlet for introducing a gas into the plasma chamber 1, 9 a shutter, 10 a specimen, 11 a gas outlet for evacuating the ion source, and 15 a neutralizer for emitting electrons to neutralize positive charges generated at the specimen 10. The plasma chamber 1 acts as an anode, and a plurality of permanent magnets (not shown) are arranged around the plasma chamber so that a cusp field is formed. In the high voltage operation of the present embodiment, a low voltage for the low voltage operation is applied between the electrodes 2 and 3, that is, a variable low voltage source (namely, a D.C. power source for generating a variable low voltage) 6 is connected between the electrodes 2 and 3, and a high, positive potential from a variable high voltage source (namely, a D.C. power source for generating a variable high voltage) 7 is applied to the electrode 3. Further, the electrode 5 is grounded, and the electrode 4 is connected to a negative voltage source (namely, a D.C. power source for generating a negative voltage) 8. A negative potential applied to the electrode 5 prevents electrons from flowing back to the plasma chamber.

On the other hand, in the low voltage operation of the present embodiment, the electrical connection of FIG. 1B is realized with the aid of switching elements (not shown). That is, the variable high voltage source 7 is turned off, and the variable low voltage source 6 is still connected between the electrodes 2 and 3. Further, the electrode 4 is grounded together with the electrode 5, and the electrode 3 is connected to the negative voltage source 8, to be applied with a negative potential, thereby preventing electrons from flowing backward.

When such a changeover operation is performed, the electric field formed between the electrodes 2 and 3 in the low voltage operation is substantially equal to that in the high voltage operation. Thus, the same ion current as in the high voltage operation can be drawn out in the low voltage operation. Incidentally, the electrode 5 may be omitted from FIGS. 1A and 1B. Further, in FIG. 1B, it is not always required to connect the negative terminal of the variable low voltage source 6 to the negative terminal of the negative voltage source 8, but the negative terminal of the voltage surce 6 may be grounded.

Figure 2:
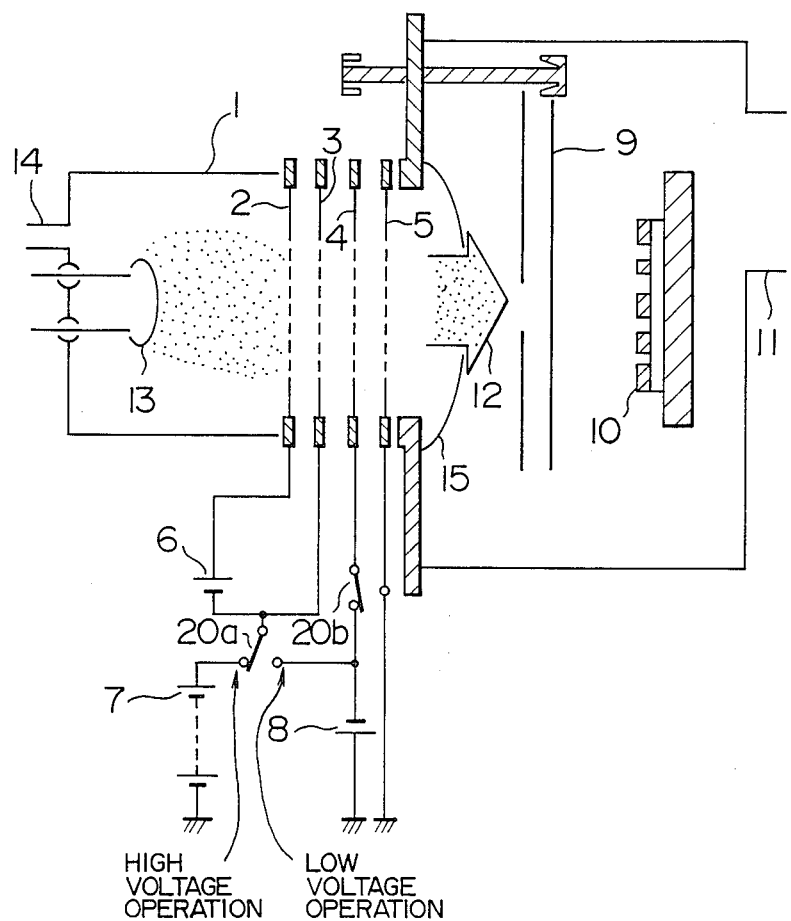
FIG. 2 is a schematic diagram showing the circuit construction of the first embodiment which includes a circuit for changing one of the high voltage operation and the low voltage operation over to the other.

FIG. 2 shows an example of a switching circuit for changing one of the high-voltage and low-voltage operations shown in FIGS. 1A and 1B over to the other.

Referring to FIG. 2, each of changeover switches 20a and 20b is operated with an external signal (not shown). When the switches 20a and 20b are put in a connected state shown in FIG. 2, the high voltage operation of FIG. 1A is realized. When the switches 20a and 20b are put in a connected state opposite to that shown in FIG. 2, the low voltage operation of FIG. 1B is realized.

Figure 3A:
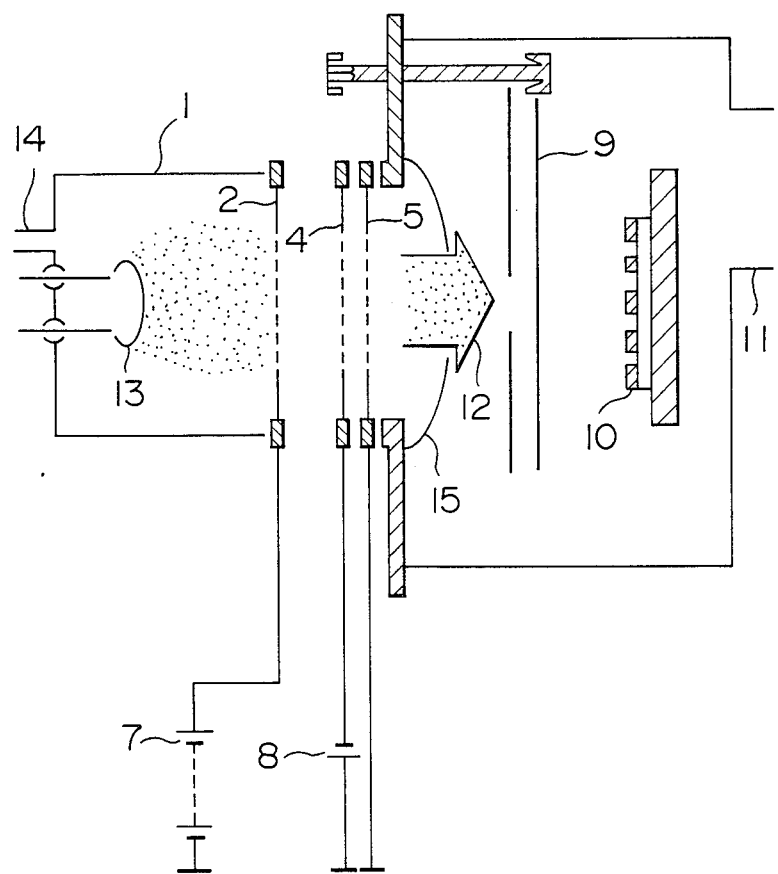
FIGS. 3A and 3B are schematic diagrams showing a high voltage operation and a low voltage operation of a second embodiment of an ion source according to the present invention, respectively.
Figure 3B:
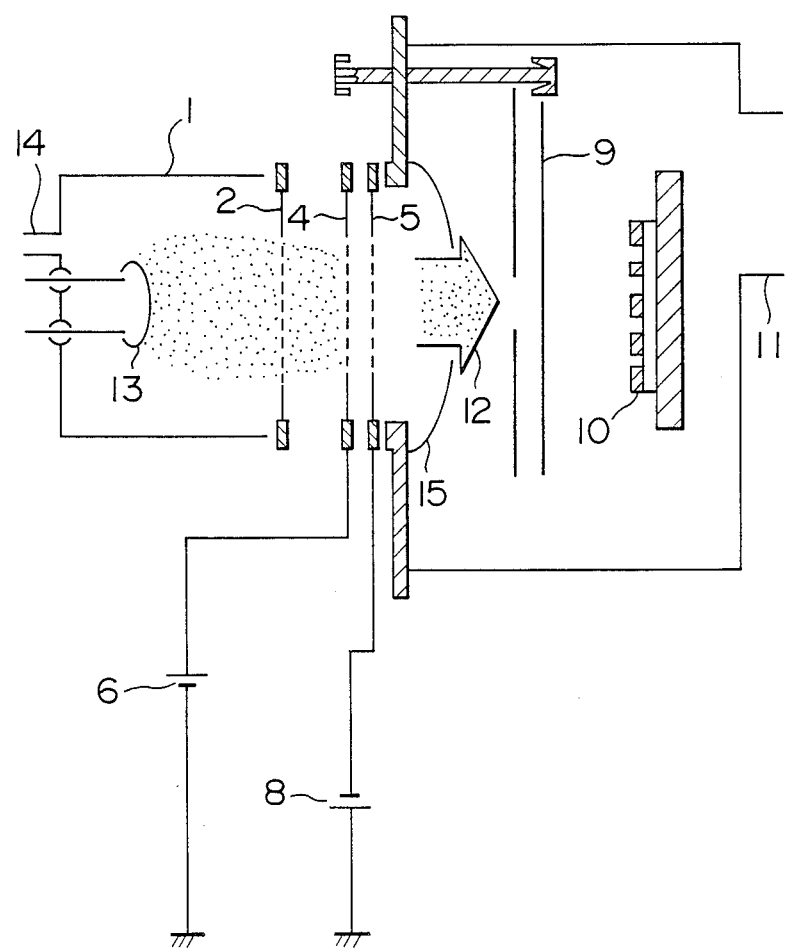

FIGS. 3A and 3B are schematic diagrams showing a second embodiment of an ion source according to the present invention. In more detail, FIG. 3A shows the electrical connection for the high voltage operation of the second embodiment, and FIG. 3B shows the electrical connection for the low voltage operation of the second embodiment. As shown in FIGS. 3A and 3B, the present embodiment includes only three electrodes 2, 4 and 5. In the high voltage operation, as shown in FIG. 3A, the variable high voltage source 7 is connected to the electrode 2, the negative voltage source 8 is connected to the electrode 4, and the electrode 5 is grounded.

Meanwhile, in the low voltage operation, as shown in FIG. 3B, the electrode 2 is put in a floating state, the variable low voltage source 6 is connected to the electrode 4, and the negative voltage source 8 is connected to the electrode 5. When the electrode 2 is put in the floating state, a plasma generated in the plasma chamber 1 passes through a region sandwiched between the electrodes 2 and 4, and thus an ion beam 12 can be drawn out from the plasma with the aid of an electric field formed between the electrodes 4 and 5.

When the above-mentioned changeover operation is performed, a low voltage for the low-voltage operation is applied to the electrode 4 as shown in FIG. 3B. Since the distance between the electrodes 4 and 5 is relatively short, a strong electric field is formed between the electrodes 4 and 5 in the low voltage operation. Thus, a large ion current can be drawn out even in the low voltage operation.

When one of the first and second embodiments is incorporated in an ion beam apparatus, a single ion source (that is, the first or second embodiment) is usable for various processes.

Figure 4:
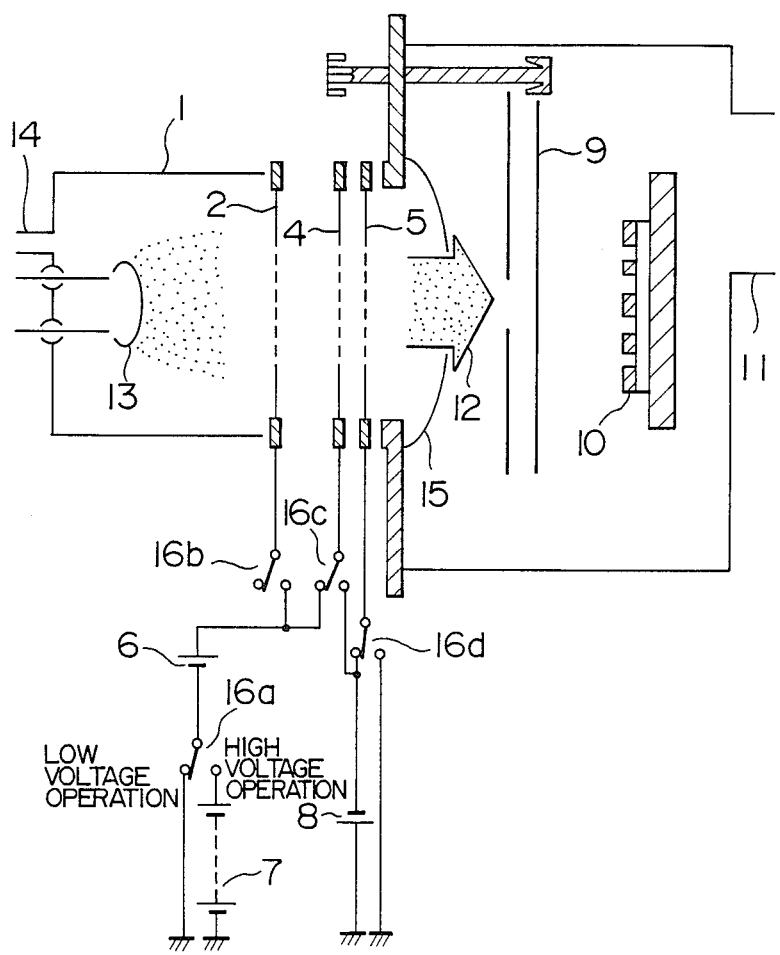
FIG. 4 is a schematic diagram showing the circuit construction of the second embodiment which includes a circuit for changing one of the high voltage operation and the low voltage operation over to the other.

FIG. 4 shows an example of a switching circuit for changing one of the high-voltage and low-voltage operations shown in FIGS. 3A and 3B over to the other. Referring to FIG. 4, each of changeover switches 16a to 16d is operated with an external signal (not shown). When the switches 16a to 16d are put in a connected state shown in FIG. 4, the low voltage operation of FIG. 3B is realized. When the switches 16a to 16d are put in a connected state opposite to that shown in FIG. 4, the high voltage operation of FIG. 3A is realized.

Figure 5:
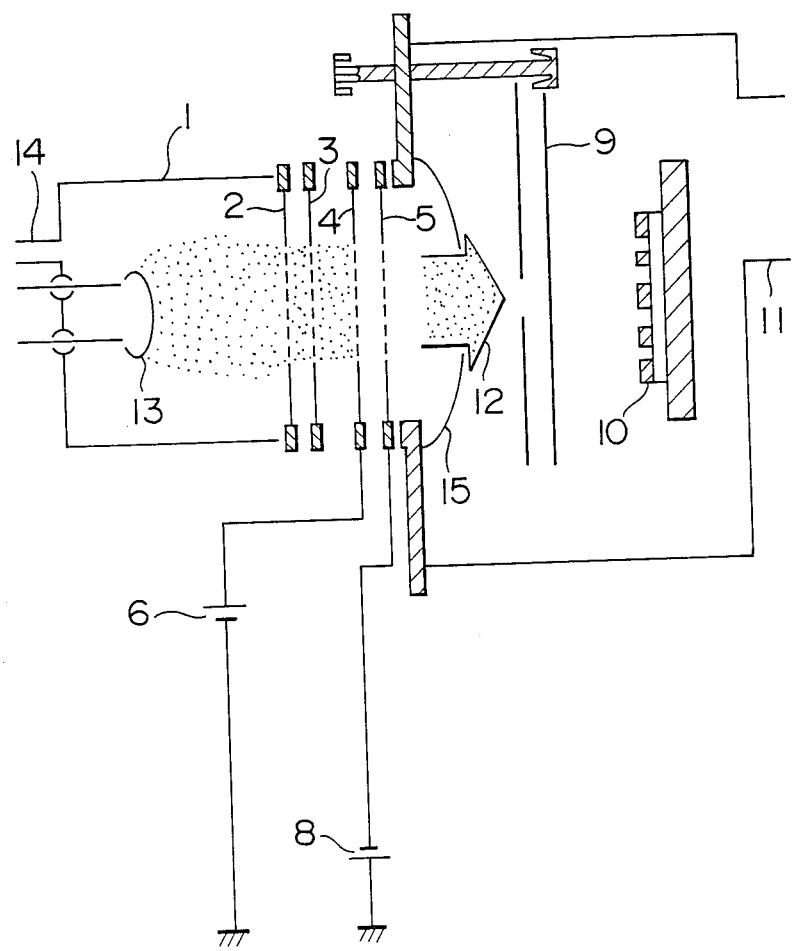
FIG. 5 is a schematic diagram which shows the circuit connection of the first embodiment for realizing a low voltage operation equivalent to the low voltage operation of FIG. 1B.

FIG. 5 shows modified electrical connection for realizing a low voltage operation of the first embodiment equivalent to the low voltage operation of FIG. 1B. Referring to FIG. 5, the electrodes 2 and 3 are put in a floating state, the electrode 4 is connected to the variable low voltage source 6, and the electrode 5 is connected to the negative voltage source 8.

The voltages applied to the electrodes are not limited to those used in the first and second embodiments, but it is only required that in the high voltage operation, a drawing voltage is applied between electrodes which are spaced apart from each other a relatively long distance, and that in the low voltage operation, another drawing voltage is applied between electrodes which are spaced apart from each other a relatively short distance.

Although a bucket-type ion source has been shown in the first and second embodiments, the present invention is not limited to such an ion source, but is applicable to any ion source having three or more drawing electrodes.

As has been explained in the foregoing, according to the present invention, there is provided an ion source having at least three parallel electrodes and operated in the following manner. In the high voltage operation of the ion source, a drawing voltage is applied between electrodes which are spaced apart from each other a relatively long distance, while, in the low voltage operation, another drawing voltage is applied between electrodes which are spaced apart from each other a relatively short distance. Moreover, one of the high-voltage and low-voltage operations can be readily changed over to the other with the aid of switching elements. Thus, an ion source according to the present invention can operate on various voltages within a wide voltage range. Further, the ion source is high in structural degree of freedom, simple in structure, and low in manufacturing cost.

We claim:

1. An ion source comprising:
   a plasma chamber for containing a plasma therein;
   at least three parallel electrodes for drawing out an ion beam from the plasma chamber, the distance between a first pair of adjacent electrodes being greater than the distance between a second pair of adjacent electrodes;
   a plurality of power sources including first and second power sources, the first power source generating a first drawing voltage, the second power source generating a second drawing voltage lower than the first drawing voltage; and
   changeover means for connecting the first power source between the first pair of adjacent electrodes at a time an ion beam of a first energy level is drawn out, and for connecting the second power source between the second pair of adjacent electrodes at a time an ion beam of a second energy level lower than the first energy level is drawn out.

2. An ion source according to claim 1, wherein each of the electrodes has a plurality of apertures.

3. An ion source according to claim 1 comprising means for using the ion source as the ion source of an ion beam mixing apparatus and the ion source of an ion beam assisted apparatus.

4. An ion source comprising:
   a plasma chamber for containing a plasma therein;
   at least three parallel electrodes for drawing out an ion beam from the plasma chamber, a first pair of adjacent electrodes being spaced apart from each other a first distance, a second pair of adjacent electrodes being spaced apart from each other a second distance smaller than the first distance, the second pair of adjacent electrodes being located between the plasma chamber and the first pair of adjacent electrodes;
   a plurality of power sources including first and second power sources, the first power source generating a first drawing voltage, the second power source generating a second drawing voltage lower than the first drawing voltage, the second power source being connected between the second pair of adjacent electrodes; and
   changeover means for connecting the first power source between the first pair of adjacent electrodes at a time a first ion beam of a first energy level is drawn out, and for disconnecting the first power source from the first pair of adjacent electrodes at a time a second ion beam of a second energy level different from the first energy level is drawn out.

5. An ion source according to claim 4, wherein a grounded electrode parallel to the parallel electrodes is additionally disposed on the ion beam output side of said at least three electrodes, and wherein a third power source is connected between that electrode of the first pair of adjacent electrodes which is located on the ion beam output side, and the grounded electrode at a time the first ion beam is drawn out, and is connected between that electrode of the second pair of adjacent electrodes which is located on the ion beam output side, and the grounded electrode at a time the second ion beam is drawn out.

6. A method of drawing out an ion beam of a desired one of a plurality of energy levels from a single ion source, the ion source having a plasma chamber and at least three parallel electrodes disposed in front of the plasma chamber, the method comprising the steps of:
   preparing a plasma;
   applying a first drawing voltage between a first pair of adjacent electrodes to draw out an ion beam of a first energy level, the first pair of adjacent electrodes being spaced apart from each other a first distance; and
   applying a second drawing voltage between a second pair of adjacent electrodes to draw out an ion beam of a second energy level different from the first energy level, the second drawing voltage being different from the first drawing voltage, the second pair of adjacent electrodes being spaced apart from each other a second distance, the second distance being different from the first distance.

* * * * *